United States Patent [19]
Woo

[11] Patent Number: 5,518,966
[45] Date of Patent: May 21, 1996

[54] METHOD FOR WET ETCHING POLYSILICON

[75] Inventor: Sang H. Woo, Kyoungki, Rep. of Korea

[73] Assignee: Hyundai Electronics Industries Co., Ltd., Kyoungki, Rep. of Korea

[21] Appl. No.: 363,358

[22] Filed: Dec. 23, 1994

[30] Foreign Application Priority Data

Dec. 28, 1993 [KR] Rep. of Korea ............... 1993-30469

[51] Int. Cl.[6] ............................................. H01L 21/469
[52] U.S. Cl. ................... 437/233; 156/662.1; 156/628.1; 156/630.1; 156/633.1; 156/654.1; 437/247
[58] Field of Search ........................... 156/662.1, 628.1, 156/630.1, 633.1, 654.1; 437/233, 247

[56] References Cited

U.S. PATENT DOCUMENTS

| | | | |
|---|---|---|---|
| 3,677,848 | 7/1972 | Stoller et al. | 156/662.1 |
| 4,071,397 | 1/1978 | Estreicher et al. | 156/662.1 |
| 4,415,383 | 11/1983 | Naem et al. | 437/233 |
| 4,554,046 | 11/1985 | Taguchi et al. | 156/662.1 |
| 4,584,055 | 4/1986 | Kayanuma et al. | 156/628.1 |
| 4,681,657 | 7/1987 | Hwang et al. | 156/662.1 |
| 5,013,675 | 5/1991 | Shen et al. | 437/44 |

FOREIGN PATENT DOCUMENTS 0120445   4/1994   Japan.

Primary Examiner—Brian E. Hearn
Assistant Examiner—Trung Dang
Attorney, Agent, or Firm—Morgan & Finnegan

[57] ABSTRACT

A method is disclosed for the wet etching of polysilicon, which comprises the steps of: annealing a lamination structure of a doped polysilicon and an undoped polysilicon at a predetermined temperature for a predetermined period; and applying to the annealed lamination structure a chemical etchant comprising nitric acid, fluoric acid, acetic acid and deionized water with the volume ratio of nitric acid to acetic acid to fluoric acid to deionized water being $30:3:x:15+(1-x)$ wherein x is a real number ranging from 0.2 to 1.0, so as to remove the doped polysilicon film. Instead of fluoric acid, alcohol may be used in the chemical etchant without affecting the etching selectivity. This method is superior in performance with regard to selective etching between the undoped polysilicon and the doped polysilicon. Therefore, the doped polysilicon which is useful in many ways, for example, storage electrode, insertion layer and contact, can be etched in such a thickness as is needed, with the chemical etchant. Consequently, the present method is very useful in developing new semiconductor devices.

11 Claims, 1 Drawing Sheet

METHOD FOR WET ETCHING POLYSILICON

BACKGROUND OF THE INVENTION

1. Field of the Invention

The present invention relates, in general, to a method for wet etching polysilicon and, more particularly, to an improvement in the etching selectivity between doped polysilicon and undoped polysilicon.

2. Description of the Prior Art

For fabrication of a semiconductor device, many etching process steps are efficiently undertaken, Of the etching process steps, wet etching, which utilizes a solution of chemical etchant, is the most frequently conducted.

A typical solution of chemical etchant for polysilicon consists mainly of nitric acid ($HNO_3$) and fluoric acid (HF). When this chemical etchant is applied to a polysilicon film, the oxygen radicals of nitric acid combine with the silicon atoms to form a silicon oxide film, which is then etched by an action of fluoric acid.

The wet etching process is characterized by two functions: etch rate and selectivity. The etch rate of the chemical etchant for polysilicon is virtually determined by both the formation rate of an oxide film through the reaction of nitric acid with silicon and the removal rate of fluoric acid for the oxide film.

During the fabrication of a semiconductor device, a patterning process step comprising etching selectively of a doped polysilicon film, which is in a state of lamination with an undoped polysilicon film, is very frequently required. For example, when a pin structure of capacitor is formed, a process for patterning selectively doped polysilicon through etching is efficiently used.

However, the typical solution of chemical etchant is not satisfactory in etching selectivity between doped polysilicon and undoped polysilicon, and it cannot remove the doped polysilicon as precisely as necessary.

SUMMARY OF THE INVENTION

The present invention has been made in view of the fact that an improvement is possible in etching selectivity between undoped polysilicon and doped polysilicon.

Therefore, it is an object of the present invention to provide a method for the wet etching of polysilicon, capable of etching doped polysilicon more rapidly than undoped polysilicon.

It is another object of the present invention to provide a chemical etchant for wet etching, superior in etching selectivity for doped polysilicon.

In accordance with an aspect of the present invention, the above objects could be accomplished by providing a method comprising the steps of: annealing a lamination structure of a doped polysilicon and an undoped polysilicon in a predetermined temperature for a predetermined period; and applying to the annealed lamination structure a chemical etchant comprising nitric acid, fluoric acid, acetic acid and deionized water with the volume ratio of nitric acid to acetic acid to fluoric acid to deionized water being 30:3:x:15+(1−x) wherein x is a real number ranging from 0.2 to 1.0, so as to remove the doped polysilicon film.

In accordance with another aspect of the present invention, alcohol may be used in the chemical etchant, instead of fluoric acid.

BRIEF DESCRIPTION OF THE DRAWINGS

The above object and other advantages of the present invention will become more apparent by describing in detail the preferred embodiments of the present invention with reference to the attached drawings in which.

DETAILED DESCRIPTION OF THE PREFERRED EMBODIMENTS

Because there is a large quantity of surplus impurities in the excess point defect and the grain boundary of the doped polysilicon, doped polysilicon is usually etched faster by a chemical etchant than undoped polysilicon, thereby causing the bond strength between silicon atoms to be weak.

Experience indicates that a suitable mixture of acetic acid and deionized water has a great deal of effectiveness in etching selectivity for polysilicon.

Accordingly, in accordance with an aspect of the present invention, there is provided a chemical etchant comprising nitric acid, fluoric acid, acetic acid and deionized water with the volume ratio of nitric acid to acetic acid to fluoric acid to deionized water being 30:3:x:15+(1−x) wherein x is a real number ranging from 0.2 to 1.0.

Figure 1:
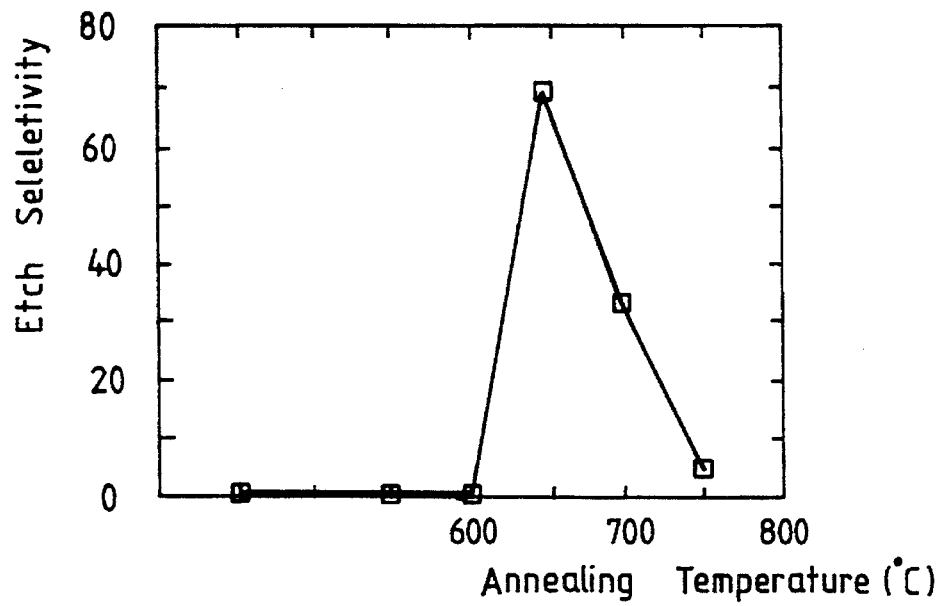
FIG. 1 shows the change of etching selectivity for doped polysilicon, plotted with regard to annealing temperature, according to the present invention.
Figure 2:
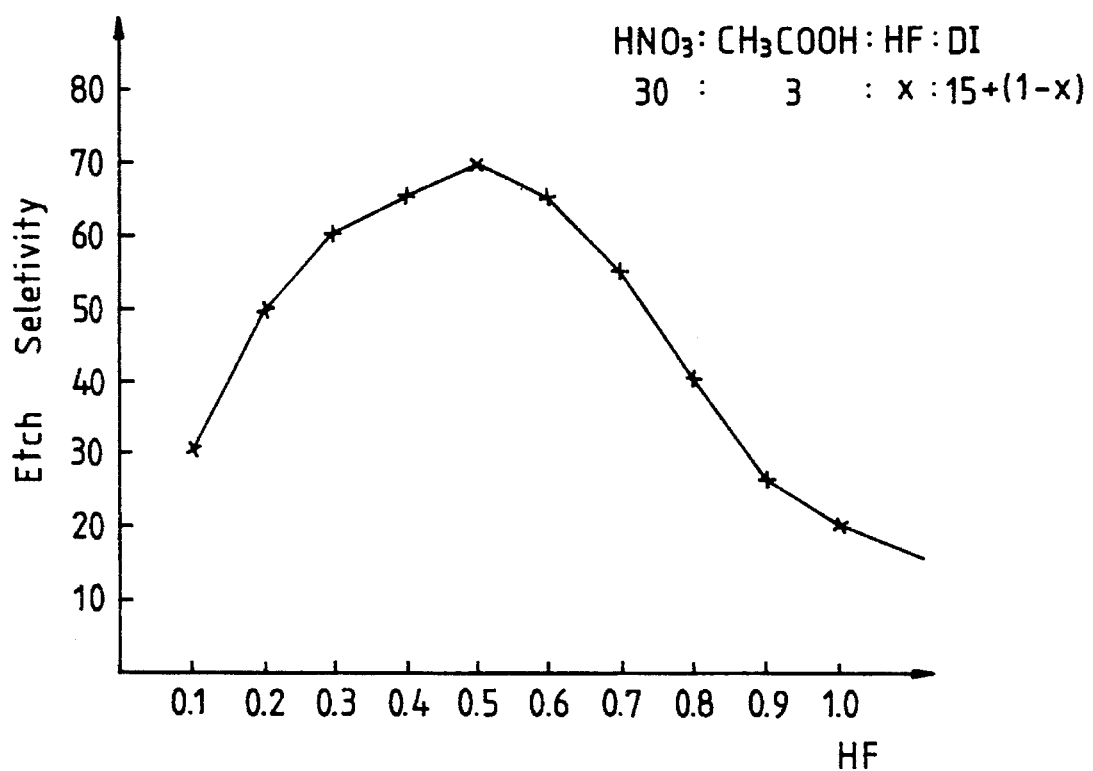
FIG. 2 shows the change of etching selectivity for doped polysilicon, plotted with regard to the volume ratio of fluoric acid, according to the present invention.

For a more detailed description of etching selectivity, reference is made to FIGS. 1 and 2.

First, referring to FIG. 1, there is plotted etching selectivity with regard to annealing temperatures. For this plot, an N-type impurity-doped polysilicon film and an undoped polysilicon film were laminated, annealed at predetermined temperatures for about 1 hour, and etched with a chemical etchant having a volume ratio of nitric acid:acetic acid:fluoric acid:deionized water of 30:3:0.5:15.5. As shown in this drawing, the etching selectivity is maximized at an annealing temperature of about 650° C. However, an annealing temperature of not more than about 600° C. exhibits an etching selectivity of 0. In other words, the doped polysilicon film and the undoped polysilicon film after annealing at 600° C. or less for about 1 hour were etched at almost the same rate. The plot indicates an etching selectivity of 30 at 700° C.

As apparent from this figure, the annealing temperature has a great influence on the etching selectivity for polysilicon.

Other experiments by the present inventors reveal that an annealing treatment under a condition of 700° C. for about 0.5 hour or at 600° C. for about 3 hours can obtain an effect similar to that obtained from under a condition of 650° C. for about 1 hour.

With reference to FIG. 2, there is plotted etching selectivity with regard to the volume ratio of fluoric acid. For this plot, an N-type impurity-doped polysilicon film and an undoped polysilicon film were laminated, annealed at predetermined temperatures for about 1 hour and etched with various chemical etchants having volume ratios of nitric acid:acetic acid:fluoric acid:deionized water of 30:3:x:15+(1−x). As shown in this figure, when the volume ratio of fluoric acid is 0.5, the etching selectivity of the chemical etchant for polysilicon is highest, exhibiting about 70%.

As described above, the chemical etchant which comprises nitric acid, acetic acid, fluoric acid and deionized water with the volume ratio of nitric acid:acetic acid:fluoric acid:deionized water being 30:3:x:15+(1−x) wherein x is a real number ranging from 0.2 to 1.0, and shows an improved etching selectivity for polysilicon film with the etch selectivity ratio of doped polysilicon to undoped polysilicon ranging from 30:1 to 70:1.

Instead of acetic acid, alcohol may be used in the chemical etchant. Accordingly, in accordance with another aspect of the present invention, there is provided a chemical etchant comprising nitric acid, fluoric acid, alcohol and deionized water with the volume ratio of nitric acid to alcohol to fluoric acid to deionized water being 30:3:x:15+(1−x) wherein x is a real number ranging from 0.2 to 1.0. In the chemical etchant, alcohol functions as a surface active agent and can improve uniformity. Alcohol useful in the chemical etchant contains 1 to 6 carbon atoms and is preferably selected from a group consisting of methanol, ethanol and isopropanol.

As described hereinbefore, the method according to the present invention is superior in performance with regard to selective etching between the undoped polysilicon and the doped polysilicon. Therefore, the doped polysilicon which is useful in many ways, for example, storage electrode, insertion layer and contact, can be etched in such a thickness as is needed, with the chemical etchant according to the present invention. Consequently, the method according to the present invention is very useful in developing new semiconductor devices.

The expression "etching selectivity" as used in this specification means the ratio of an etched thickness of doped polysilicon to an etched thickness of undoped polysilicon.

Other features, advantages and embodiments of the invention disclosed herein will be readily apparent to those exercising ordinary skill after reading the foregoing disclosures. In this regard, while specific embodiments of the invention have been described in considerable detail, variations and modifications of these embodiments can be effected without departing from the spirit and scope of the invention as described and claimed.

What is claimed is:

1. A method for selectively etching a lamination structure of an undoped polysilicon film and a doped polysilicon film comprising the steps of:

annealing the lamination structure in a selected temperature for a selected period; and applying to the annealed lamination structure a chemical etchant comprising nitric acid, fluoric acid, acetic acid and deionized water with the volume ratio of nitric acid to acetic acid to fluoric acid to deionized water being 30:3:x:15+(1−x) wherein x is a real number ranging from 0.2 to 1.0, so as to remove the doped polysilicon film.

2. A method in accordance with claim 1, wherein the lamination structure is annealed at about 650° C. for about 1 hour.

3. A method in accordance with claim 1, wherein the lamination structure is annealed at about 600° C. for about 3 hours.

4. A method in accordance with claim 1, wherein the lamination structure is annealed at about 700° C. for about 0.5 hour.

5. A method in accordance with claim 1, wherein the volume ratio of nitric acid to acetic acid to fluoric acid to deionized water is 30:3:0.5:15.5.

6. A method for selectively etching a lamination structure of an undoped polysilicon film and a doped polysilicon film comprising the steps of:

annealing the lamination structure at a selected temperature for a selected period; and applying to the annealed lamination structure a chemical etchant comprising nitric acid, fluoric acid, alcohol and deionized water with the volume ratio of nitric acid to alcohol to fluoric acid to deionized water being 30:3:x:15+(1−x) wherein x is a real number ranging from 0.2 to 1.0, so as to remove the doped polysilicon film.

7. A method in accordance with claim 6, wherein the lamination structure is annealed at about 650° C. for about 1 hour.

8. A method in accordance with claim 6, wherein the lamination structure is annealed at about 600° C. for about 3 hours.

9. A method in accordance with claim 6, wherein the lamination structure is annealed at about 700° C. for about 0.5 hour.

10. A method in accordance with claim 6, wherein the alcohol is selected from a group consisting of methyl alcohol, ethyl alcohol and isopropyl alcohol.

11. A method in accordance with claim 6, wherein the volume ratio of nitric acid to alcohol to fluoric acid to deionized water is 30:3:0.5:15.5.

* * * * *